United States Patent [19]

Dhillon et al.

[11] Patent Number: 4,912,021

[45] Date of Patent: Mar. 27, 1990

[54] DEVELOPER-FINISHER COMPOSITIONS FOR LITHOGRAPHIC PLATES

[75] Inventors: Major S. Dhillon, Belle Mead; Shane Hsieh, Bridgewater; Douglas A. Seeley, High Bridge, all of N.J.

[73] Assignee: Hoechst Celanese Corporation, Somerville, N.J.

[21] Appl. No.: 368,466

[22] Filed: Jun. 19, 1989

Related U.S. Application Data

[62] Division of Ser. No. 151,652, Feb. 3, 1988, Pat. No. 4,873,174.

[51] Int. Cl.$^4$ .............................. G03C 5/24; G03F 7/02
[52] U.S. Cl. ..................................... 430/331; 430/309; 430/325
[58] Field of Search ................ 430/309, 331, 325; 101/424; 252/135, 139, 153, 174.24, 174.17, 542, 143, 174.19, 531, 550, 405

[56] References Cited

U.S. PATENT DOCUMENTS

| | | | |
|---|---|---|---|
| 3,954,472 | 5/1976 | Walls | 430/154 |
| 4,186,006 | 1/1980 | Kobayashi | 430/302 |
| 4,308,340 | 12/1981 | Walls | 430/331 |
| 4,339,530 | 7/1982 | Sprintschnik et al. | 430/331 |
| 4,350,756 | 9/1982 | Burch et al. | 430/331 |
| 4,436,807 | 3/1984 | Walls | 430/331 |
| 4,592,992 | 6/1986 | Hsieh et al. | 430/309 |
| 4,692,397 | 9/1987 | Liu | 430/325 |

*Primary Examiner*—Paul R. Michl
*Assistant Examiner*—Patrick Doody
*Attorney, Agent, or Firm*—Plottel & Roberts

[57] ABSTRACT

A developing and finishing composition for lithographic printing plates containing:
 a. a mono-, di-, or tri-sodium potassium or lithium phosphate; and
 b. benzyl alcohol, phenoxyethanol or phenoxypropanol; and
 c. polyvinyl pyrrolidone, dextrin, poly (methyl vinyl ether/maleic acid) or gum arabic; and
 d. citric acid or benzoic acid; and
 e. sodium or potassium octyl sulfate; and
 f. sodium, potassium or lithium benzoate; and
 g. sodium, potassium or ammonium citrate; and
 h. sodium, potassium or ammonium sorbate; and
 i. sufficient water to formulate an effective developer.

22 Claims, No Drawings

DEVELOPER-FINISHER COMPOSITIONS FOR LITHOGRAPHIC PLATES

This is a divisional of application Ser. No. 07/151,652 filed on Feb. 3, 1988, now U.S. Pat. No. 4,873,174.

BACKGROUND OF THE INVENTION

The present invention relates to developer-finisher compositions for photographic elements comprising photosensitive coatings on substrates, or more particularly to developer-finisher compositions for removing and desensitizing the non-image areas of exposed, usually negative working lithographic printing plates.

Lithographic printing plates generally are composed of an aluminum containing substrate which may or may not have been treated with a variety processes recognized in the art process including anodization, graining and hydrophilization. The thusly prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419 which are incorporated herein by reference.

It is known in the art to prepare developing compositions for lithographic plates. Likewise desensitizing finishers are also known. Attempts have been made in the past to prepare single composition developer/finishers, however, these suffer from drawbacks such as incompatibility of the components. In general, one cannot simply mix a developer and a finisher to obtain a useful developer/finisher. Developer compositions remove the non-image portion of the plate after it has been imagewise exposed. A finisher must function to desensitize the non-image areas to assure that they will not accept greasy ink upon printing. The finisher also prevents oxidation of the background areas of the plate during storage or while waiting for press mounting. The finisher must also be quickly removable from the plate so that it will not cause production delays. Typically the finisher must be quickly removable by a water rinse or most preferably must be removable by the fountain solution used on the press. Quick rollup is then essential in order to prevent paper waste and reduced production time. The developer/finisher should also bind removed non-image particles of the photosensitive surface so they are not re-deposited back onto the plate.

In the past, various methods of developing printing plates have been employed. Such methods include the use of compositions containing organic solvents, surfactants, salts, acids and other art recognized materials in solution. Typically prior art developing compositions are described in U.S. Pat. No. 2,754,279; 4,381,340 and German OLS 2,216,419. It is most desirable to have a developer composition which is capable of completing development in a short period of time. The oleophilic image areas of the printing plate should be ink receptive and water repellant whereas the hydrophilic non-image areas should be water receptive and greasy ink repellant.

The proper selection of the solvent in a developer solution is very important. If the selected solvent in a developer solution is a good solvent of the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly in negative working plates, nonimage areas comprising resin binders such as acetals, and particularly polyvinyl formal, solvate in the developer solution and separate from the support and contract to spherical shapes in a highly tacky condition. Such solvated particles may otherwise deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet. A balance of developer properties is necessary where adequate speed of development is attained with a minimum of redeposited particles.

Efforts have been made to prepare developer/finishers which, as the name suggests, develop and prepare a plate for the printing press or for storage in a single operation. This objective has become particularly desirable with the advent of processing machines. Examples of such solutions include U.S. Pat. No. 2,754,279 and German Offenlegungsschrift No. 2,216,419. The latter two patents describe two-phase developer/finishers.

In the use of both developers and developer/finishers in machines, problems arise in the etching and plating of the process as a result of the ingredients of the developer or developer/finisher.

It is an object of this invention to provide a developer and developer/finisher for both machine and hand development of lithographic printing plates having resin binders in their photosensitive coatings, which will enable the operator to prepare a plate free from objectionable redeposit.

It is another object of this invention to provide processing solutions which combine the above objects with good hydrophilization of the nonimage areas and oleophilization of the image areas.

These and other objects will become apparent in the detailed description of the preferred embodiment.

SUMMARY OF THE INVENTION

The invention provides a developing, desensitizing and finishing composition for lithographic printing plates which comprises in admixture:

a. from about 0.1% to about 10.0% by weight of the composition of one or more compounds selected from the group consisting of mono-, di-, or tri-sodium, potassium or lithium phosphate; and b. from about 0.1% to about 10.0% by weight of the composition of one or more compounds selected from the group consisting of benzyl alcohol, phenoxyethanol and phenoxypropanol; and c. from about 0.1% to about 10.0% by weight of the composition of one or more resins selected from the group consisting of polyvinyl pyrrolidone, dextrin, poly (methyl vinyl ether/maleic acid) and gum arabic; and d. from about 0.1% to about 10.0% by weight of the composition of one or more acids selected from the group consisting of citric acid and benzoic acid; and e. from about 0.5% to about 15.0% by weight of the composition of one or more compounds selected from the group consisting of sodium or potassium octyl sulfate; and f. from about 1.0% to about 15.0% by weight of the composition of one or more compounds selected from the group consisting of sodium, potassium and lithium benzoate; and g. from about 0.2% to about 10.0% by weight of the composition of one or more components selected from the group consisting of sodium, potassium and ammonium citrate; and h. from about 0.2% to about 15.0% by weight of the composition of one or more components selected from the group consisting of sodium, potassium and ammonium sorbate; and i. sufficient water to formulate an effective developer.

The invention further provides a method for preparing a photographic element which comprises imagewise exposing a photographic element comprising a light sensitive negative working or positive working photographic composition disposed on a substrate with sufficient actinic radiation to form a latent image and then simultaneously removing the non-image areas of said exposed element and desensitizing the non-image areas with a developer/finisher composition comprising the foregoing admixture.

DETAILED DESCRIPTION OF THE PREFERRED EMBODIMENT

As the first step in the production of photographic elements such as lithographic printing plates, a sheet substrate such as aluminum compositions suitable for the manufacture of lithographic printing plates such as, Alcoa 3003 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with a light sensitive polymeric diazonium salt or photopolymer containing composition. Such compositions may also contain binding resins, such as polyvinyl formal resins, colorants acid stabilizers, surfactants, exposure indicators or other art recognized ingredients.

The photosensitive sheet material is then exposed to a suitable radiation source through a mask or transparency, and the exposed sheet then developed for removal of the non-image photosensitive materials.

The photosensitive coating mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2+X-$, wherein A is an aromatic or heterocyclic residue and X is the anion of an acid.

Specific examples of light sensitive negative working diazonium materials useful as aforementioned include higher molecular weight compositions obtained, for example, by the condensation of certain aromatic diazonium salts in an acid condensation of certain compounds such as formaldehyde, as disclosed for example in U.S. Pat. Nos. 2,063,631 and 2,667,415. A preferred class of diazonium compounds is described in U.S. Pat. No. 3,849,392. All of the foregoing patents are incorporated herein by reference. A most preferred diazonium salt is the polycondensation product of 3-methoxy-4-diazodiphenyl amine sulfate and 4,4,'-bis-methoxy methyldiphenyl ether, precipitated as the mesitylene sulfonate, as taught in U.S. Pat. No. 3,849,392. Suitable photopolymerizable compositions are also well known to the skilled artisan.

The present invention provides a method for developing and finishing such exposed photosensitive elements by contacting them, to remove the non-image areas, using a developer/finisher which contains the aforementioned ingredients in an aqueous mixture. The mixture preferably has a pH which is in the range of from about 5.8 to about 7.8, more preferably from about 6.0 to about 7.0 and most preferably from about 6.3 to about 6.6.

The developer contains a sodium or potassium octyl sulfate surfactant component which is present in a preferred range of from about 0.5% to about 15.0% by weight of the developer. A more preferred range is from about 1.0% to about 10.0% and most preferably from about 4.0% to about 7.0%.

The developer also contains from about 1.0% to about 15.0% by weight of the developer of one or more of sodium, lithium and potassium benzoate. A more preferred range is from about 2.5% to about 10.0% and most preferably from about 5.0% to about 7.5%.

The developer further contains from about 0.1% to about 10.0% by weight of the developer of one or more compounds selected from the group consisting of citric and benzoic acids. A more preferred range is from about 0.6% to about 5.0% and most preferably from about 0.6% to about 1.5%.

The developer also contains from about 0.1% to about 10.0% by weight of the developer of one or more compounds selected from the group consisting of mono-, di- or tri-sodium, potassium or lithium phosphate. A more preferred range is from about 0.5% to about 5.0% and most preferably from about 0.7% to about 1.5%.

The developer further contains from about 0.1% to about 10.0% by weight of the developer of one or more compounds selected from the group consisting of benzyl alcohol, phenoxyethanol, and phenoxypropanol. A more preferred range is from about 0.5% to about 5.0% and most preferably from about 1.0% to about 2.5%.

The developer also contains from about 0.2% to about 10.0% by weight of the developer of one or more of sodium, potassium and ammonium citrate. A more preferred range is from about 0.5% to about 5.0% and most preferably from about 0.7% to about 2.0%.

The developer further contains from about 0.2% to about 15.0% by weight of the developer of one or more compounds selected from the group consisting of sodium, potassium and ammonium sorbate. A more preferred range is from about 0.5% to about 10.0% and most preferably from about 1.0% to about 4.0%. The developer also contains from about 0.1% to about 10.0% by weight of the developer of one or more resins selected from the group consisting of polyvinyl pyrrolidone, dextrin, poly (methyl vinyl ether/maleic acid) and gum arabic. A more preferred range is from about 0.5% to about 5.0% and most preferably from about 1.0% to about 3.0%. The developer additionally optionally contains one or more components selected from the group consisting of sodium, potassium, magnesium and ammonium sulfates and sulfites. When such are used, they are present in an amount of from about 0.01% to about 5.0% by weight of the developer. A more preferred range is from about 0.05% to about 1.5% and most preferably from about 0.1% to about 0.5%.

In the preferred embodiment, the developer of the present invention preferably contains optional minor amounts of a conventional anti-foam component which aids in processing of the printing plate. This component, when it is used is preferably present in an amount of from about 0.02% to about 0.05% by weight of the developer. One preferred anti-foam agent is Dow DB-31 which is a silicone type anti-foam. The developer then contains sufficient water to formulate an effective developer. The developer is capable of substantially completely removing the non-image areas of a photographic element in about 2 minutes or less while simultaneously removing substantially none of the image areas. Substantially none of the material comprising said non-image areas is re-deposited back onto said photographic element.

The following non-limiting examples serve to illustrate the invention.

EXAMPLE 1

An ENCO ® A-30 negative working printing plate available commercially from Hoechst Celanese Corporation is imagewise exposed to actinic radiation in a manner well known to the skilled artisan. The thusly exposed plate is then processed with the following developer/finisher composition:

| Ingredients | Weight Percent |
| --- | --- |
| Soft water | 79.506 |
| Citric acid | 0.076 |
| Sodium citrate 2H$_2$O | 0.923 |
| Lithium benzoate | 6.944 |
| Potassium sorbate | 2.311 |
| Sodium octyl sulfate | 5.557 |
| Phenoxypropanol | 1.853 |
| Monosodium phosphate | 1.000 |
| Polyvinylpyrrolidone K-15 | 1.800 |
| Antifoam DB-31 | 0.030 |

The plate develops cleanly in a customary developing machine without noticeable background staining or re-deposit of removed plate coatings.

EXAMPLE 2

Example 1 is repeated with an Enco A-60 negative working printing plate available commercially from Hoechst Celanese Corporation. Similar results are noted.

EXAMPLE 3

ENCO presensitized A-60 plates are imagewise exposed to 290 mJ/cm$^2$. The exposed plates are hand developed by using the following developer finisher:

| Ingredients | Weight Percent |
| --- | --- |
| Soft Water | 79.506 |
| Citric Acid Anhydrous | 0.076 |
| Sodium Citrate .2H$_2$O | 0.923 |
| Lithium Benzoate | 6.944 |
| Potassium Sorbate | 2.311 |
| Sodium Octyl Sulfate | 5.557 |
| Monosodium Phosphate | 1.000 |
| Polyvinylpyrrolidone K-15 | 1.800 |
| Dowanol (R) PPH Glycol Ether | 1.853 |
| Antifoam DB-1430 | 0.030 |

Development Procedures (i) An imagewise exposed ENCO A-60 plate is placed in the developing sink. The developer finisher (about 30 ml/sq ft) is poured and spread over the plate surface. After 10 seconds of dwell time, the plate is developed with cotton or Webril Appli-Pads until the background is clean. The plate is buffed dry without a water wash.

(ii) An imagewise exposed ENCO A-60 plate is placed on a stack of Newspapers. The developer finisher is poured (30 ml/sq ft) and spread over the plate surface. The plate is developed after a 10 second dwell time with Webril Appli-Pads and buffed dry.

(iii) An imagewise exposed ENCO A-60 plate is placed on a chipboard. The plate is developed with Webril Appli-Pads using 30 ml of developer finisher per sq. ft of plate surface. The plate is then buffed dry. The developed plates are put on a Heidelberg-Sork-3 press for a press roll up test. The ink density is set at 1.2 for uncoated paper and 1.4 for a coated paper. All the plates rolled up cleanly.

The developed plates are placed in an environmental room at 26.7° C. and 80% R.H. for 24 hours for a holdover test. The plates are put on the Heidelberg-Sork-3 press after a 24 hour holdover under humid conditions. An acceptable print quality is obtained.

EXAMPLE 4

| Ingredients | Weight Percent |
| --- | --- |
| Water | 76.306 |
| Citric Acid Anhydrous | 0.076 |
| Sodium Citrate .2H$_2$O | 0.923 |
| Lithium Benzoate | 6.944 |
| Potassium Sorbate | 2.311 |
| Sodium Octyl Sulfate | 5.557 |
| Dowanol (R) PPH Glycol Ether | 1.853 |
| Monosodium Phosphate | 1.030 |
| Polyvinylpyrrolidone K-15 | 3.000 |
| Dowfax 2A1 | 2.000 |

The developer finisher formulations of example 4 is evaluated by the procedures of example 3 using ENCO A-60 plates and similar lithographic properties are obtained as reported in example 3.

What is claimed is:

1. A developing and finishing composition for lithographic printing plates which comprises in admixture:
   a. from about 0.1% to about 10.0% by weight of the composition of one or more compounds selected from the group consisting of mono-, di-, or trisodium, potassium or lithium phosphate; and
   b. from about 0.1% to about 10.0% by weight of the composition of one or more compounds selected from the group consisting of benzyl alcohol, phenoxyethanol and phenoxypropanol; and
   c. from about 0.1% to about 10.0% by weight of the composition of one or more resins selected from the group consisting of polyvinyl pyrrolidone, dextrin, poly (methyl vinyl ether/maleic acid) and gum arabic; and d. from about 0.1% to about 10.0% by weight of the composition of one or more acids selected from the group consisting of citric acid and benzoic acid; and e. from about 0.5% to about 15.0% by weight of the composition of one or more compounds selected from the group consisting of sodium or potassium octyl sulfate; and f. from about 1.0% to about 15.0% by weight of the composition of one or more compounds selected from the group consisting of sodium, potassium and lithium benzoate; and g. from about 0.2% to about 10.0% by weight of the composition of one or more components selected from the group consisting of sodium, potassium and ammonium citrate; and h. from about 0.2% to about 15.0% by weight of the composition of one or more components selected from the group consisting of sodium, potassium and ammonium sorbate; and i. sufficient water to formulate an effective developer.

2. The composition of claim 1 further comprising from about 0.01% to about 5.0% by weight of the composition of one or more components selected from the group consisting of sodium, potassium, magnesium and ammonium sulfates and sulfites.

3. The composition of claim 1 further comprising an anti-foam agent.

4. The composition of claim 1 wherein component (a) comprises monosodium phosphate.

5. The composition of claim 1 wherein component (b) comprises phenoxy propanol.

6. The composition of claim 1 wherein component (c) comprises polyvinyl pyrrolidone.

7. The composition of claim 1 wherein component (d) comprises citric acid.

8. The composition of claim 1 wherein said component (e) comprises sodium octyl sulfate.

9. The composition of claim 1 wherein said component (f) comprises lithium benzoate.

10. The composition of claim 1 wherein component (g) comprises sodium citrate.

11. The composition of claim 1 wherein component (h) comprises potassium sorbate.

12. The composition of claim 1 wherein component (a) is present in an amount of from about 0.5% to about 5.0% based on the weight of the composition.

13. The composition of claim 1 wherein component (b) is present in an amount of from about 0.5% to about 5.0% based on the weight of the composition.

14. The composition of claim 1 wherein component (c) is present in an amount of from about 0.5% to about 5.0% based on the weight of the composition.

15. The composition of claim 1 wherein component (d) is present in an amount of from about 0.04% to about 5.0% based on the weight of the composition.

16. The composition of claim 1 wherein component (e) is present in an amount of from about 1.0% to about 10.0% based on the weight of the composition.

17. The composition of claim 1 wherein component (f) is present in an amount of from about 2.5% to about 10.0% based on the weight of the composition.

18. The composition of claim 1 wherein component (g) is present in an amount of from about 0.5% to about 5.0% based on the weight of the composition.

19. The composition of claim 1 wherein component (h) is present in an amount of from about 0.5% to about 10.0% based on the weight of the composition.

20. The composition of claim 1 wherein component (a) comprises monosodium phosphate, and component (b) comprises phenoxy propanol, and component (c) comprises polyvinyl pyrrolidone, and component (d) comprises citric acid, and component (e) comprises sodium octyl sulfate, and component (f) comprises lithium benzoate, and component (g) comprises sodium citrate and component (h) comprises potassium sorbate.

21. The composition of claim 1 wherein component (a) is present in an amount of from about 0.7% to about 1.5%, and component (b) is present in an amount of from about 1.0% to about 2.5%, and component (c) is present in an amount of from about 1.0% to about 3.0% and component (d) is present in an amount of from about 0.06% to about 1.5%, and component (e) is present in an amount of from about 4.0% to about 7.0%, and component (f) is present in an amount of from about 5.0% to about 7.5% and component (g) is present in an amount of from about 0.7% to about 2.0% and component (h) is present in an amount of from about 1.0% to about 4.0%, wherein said amounts are based on the weight of the composition.

22. The composition of claim 20 wherein component (a) is present in an amount of from about 0.7% to about 1.5%, and component (b) is present in an amount of from about 1.0% to about 2.5%, and component (c) is present in an amount of from about 1.0% to about 3.0% and component (d) is present in an amount of from about 0.06% to about 1.5%, and component (e) is present in an amount of from about 4.0% to about 7.0%, and component (f) is present in an amount of from about 5.0% to about 7.5% and component (g) is present in an amount of from about 0.7% to about 2.0% and component (h) is present in an amount of from about 1.0% to about 4.0%, wherein said amounts are based on the weight of the composition.

* * * * *